United States Patent
Gupta et al.

(10) Patent No.: US 10,840,915 B2
(45) Date of Patent: *Nov. 17, 2020

(54) USE OF A RAW OSCILLATOR AND FREQUENCY LOCKED LOOP TO QUICKEN LOCK TIME OF FREQUENCY LOCKED LOOP

(71) Applicant: STMicroelectronics International N.V., Schiphol (NL)

(72) Inventors: Nitin Gupta, Kurukshetra (IN); Jeet Narayan Tiwari, Greater Noida (IN)

(73) Assignee: STMicroelectronics International N.V., Schipol (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/740,871

(22) Filed: Jan. 13, 2020

(65) Prior Publication Data

US 2020/0153442 A1    May 14, 2020

Related U.S. Application Data

(63) Continuation of application No. 15/924,584, filed on Mar. 19, 2018, now Pat. No. 10,566,980.

(51) Int. Cl.
*H03L 7/07* (2006.01)
*H03L 7/099* (2006.01)
*H03L 7/095* (2006.01)

(52) U.S. Cl.
CPC ............... *H03L 7/07* (2013.01); *H03L 7/095* (2013.01); *H03L 7/0992* (2013.01); *H03L 2207/50* (2013.01)

(58) Field of Classification Search
CPC ....................................................... H03L 7/07
USPC .............................................................. 331/2
See application file for complete search history.

(56) References Cited

U.S. PATENT DOCUMENTS

| | | | |
|---|---|---|---|
| 6,229,400 B1 | 5/2001 | McCollough et al. | |
| 7,898,343 B1 | 3/2011 | Janesch | |
| 10,566,980 B2 * | 2/2020 | Gupta | ..................... H03L 7/113 |
| 2016/0269035 A1 | 9/2016 | Wentzloff et al. | |

* cited by examiner

*Primary Examiner* — Joseph Chang
(74) *Attorney, Agent, or Firm* — Crowe & Dunlevy

(57) ABSTRACT

A method of quickly locking a locked loop includes generating an intermediate reference signal having an intermediate reference frequency between a desired output frequency and a reference frequency of a reference signal, and setting an output frequency of a controllable oscillator to the desired output frequency using a first locked loop having a first loop divider value. The first loop divider value is set such that the intermediate reference frequency multiplied by the first loop divider value is equal to the desired output frequency. The controllable oscillator is then coupled to a second locked loop when the first locked loop locks, with the second locked loop is being activated. The first locked loop is then deactivated.

21 Claims, 2 Drawing Sheets

USE OF A RAW OSCILLATOR AND FREQUENCY LOCKED LOOP TO QUICKEN LOCK TIME OF FREQUENCY LOCKED LOOP

RELATED APPLICATION

This application is a continuation of U.S. patent application Ser. No. 15/924,584, filed Mar. 19, 2018, the contents of which are incorporated by reference.

TECHNICAL FIELD

This disclosure is directed to the field of locked loop circuits and, in particular, to techniques and circuits for quickening the lock time of a phase locked loop with a high loop divider value by using a frequency locked loop with a lower loop divider value to set the controllable oscillator of the phase locked loop to the desired output frequency.

BACKGROUND

Locked loop circuits, such as phase locked loop circuits, are basic components of radio, wireless, and telecommunication technologies. A phase locked loop (PLL) is a control system that generates an output signal having a phase related to the phase of an input signal.

A sample PLL is now described with reference to FIG. 1. The PLL 50 includes a variable frequency oscillator 58 (here, a voltage controller oscillator (VCO)), a divider 60, a phase frequency detector (PFD) 52, a charge pump 54, and a loop filter 56. The VCO 58 generates a periodic signal Fout, and the divider 60 divides the frequency of the output signal Fout to produce signal Fdiv. The phase frequency detector 52 compares the phase of that signal Fdiv with the phase of a reference periodic signal Fref, and generates the control signals UP, DN for the charge pump 54 based upon that phase comparison. When the phase of the signal Fref leads the phase of the signal Fdiv, the control signal UP is asserted at a logic high, while the control signal DN remains at a logic low and the voltage Vp at the output of the charge pump 54 increases. Conversely, when the phase of the signal Fref lags the phase of the signal Fdiv, the control signal DN is asserted at a logic high, while the control signal UP remains at a logic low and the voltage Vp does not change. When the phase of the signal Fref and the phase of the signal Fdiv match, neither UP nor DN are asserted at a logic high.

The voltage Vp output from the charge pump 54 is used to generate a control signal Vc for the VCO 58, by passing voltage Vp through the loop filter 56, which is typically a low pass filter operating to extract the low frequency content of the voltage Vp. The VCO 58, in response to the control signal, adjusts the phase and frequency of the output signal Fout. When UP is asserted, the voltage of the control signal Vc increases and the frequency of Fout also increases. Conversely, when DN is asserted, the voltage of the control signal Vc decreases and the frequency of Fout also decreases. Since the phase of the signal Fref cannot both lead and lag the phase of the signal Fdiv, the phase frequency detector 52 will not simultaneously assert both UP and DN.

In addition to synchronizing signals, the PLL 50 can track an input frequency, or it can generate a frequency that is a multiple (or fraction) of the input frequency.

Such phase locked loops are widely employed in radio, telecommunications, computers and other electronic applications. They can be used to provide inputs to circuits that demodulate a signal, recover a signal from a noisy communication channel, generate a stable frequency at multiples of an input frequency (frequency synthesis), or distribute precisely timed clock pulses in digital logic circuits such as microprocessors. Since a single integrated circuit can provide a complete phase locked loop building block, phase locked loops are widely used in modern electronic devices, with output frequencies from a fraction of a hertz up to many gigahertz.

In some cases, it may be desirable for a phase locked loop to multiply a relatively low reference frequency Fref, on the order of tens of kilohertz, to a relatively high output frequency Fout, on the order of tens of megahertz. While phase locked loops capable of performing this functionality exist, the time to achieve lock for such phase locked loop circuits is about 1 millisecond, which may be too long or certain applications requiring a fast wake up time.

Therefore, further development work on PLL circuits is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

A method disclosed herein includes: generating an intermediate reference signal having an intermediate reference frequency between a desired output frequency and a reference frequency of a reference signal; setting an output frequency of a controllable oscillator to the desired output frequency using a first locked loop having a first loop divider value, the first loop divider value being set such that the intermediate reference frequency multiplied by the first loop divider value is equal to the desired output frequency; and coupling the controllable oscillator to a second locked loop and activating the second locked loop.

A circuit disclosed herein includes: an oscillator configured to generate an intermediate signal having a frequency equal to a geometric mean of an input frequency and a desired output frequency, but due to unideal behavior of the oscillator, actually generating the intermediate signal as having a frequency between the input frequency and a desired output frequency but not equal to the geometric mean of the input frequency and the desired output frequency; a controllable oscillator; calibration logic configured to estimate a result of division of the desired output frequency by the frequency of the intermediate signal to produce a first locked loop divider value; a first locked loop configured to set the controllable oscillator to the desired output frequency by causing multiplication of the input frequency by the first locked loop divider value; and a switch coupling a second locked loop to the controllable oscillator when the first locked loop achieves lock, the second locked loop configured to maintain the controllable oscillator at the desired output frequency.

A circuit disclosed herein includes: an input receiving a reference signal having an input frequency; an oscillator configured to generate an intermediate signal having a frequency between the input frequency and a desired output frequency; calibration logic configured to generate a loop division number that would produce the desired output frequency when multiplied by the frequency of the intermediate signal; and a locked loop circuit. The locked loop circuit includes: a controllable oscillator; a first locked loop portion coupled to the controllable oscillator, receiving as input the intermediate signal and the loop division number, and configured to cause the controllable oscillator to generate a first locked loop output signal having an output frequency substantially equal to the desired output frequency; and a second locked loop portion coupled to the controllable oscillator and configured to cause the controllable oscillator to generate a second locked loop output signal having a frequency substantially equal to the desired output frequency and having a phase locked to a phase of the reference signal.

DETAILED DESCRIPTION

One or more embodiments will be described below. These described embodiments are only examples of implementation techniques, as defined solely by the attached claims. Additionally, in an effort to provide a focused description, irrelevant features of an actual implementation may not be described in the specification.

Figure 1:
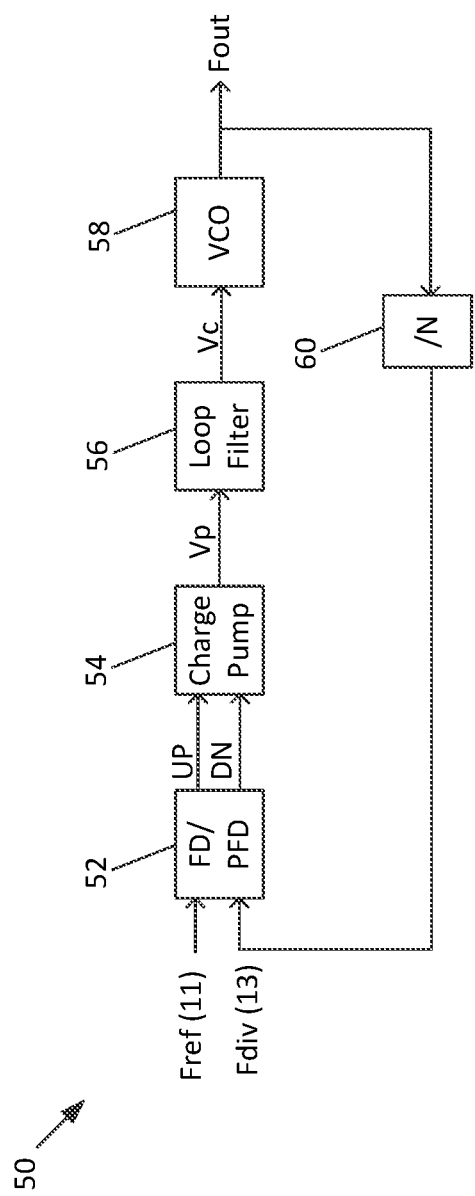
FIG. 1 is a schematic block diagram of a generic phase locked loop utilizing a charge pump.
Figure 2:
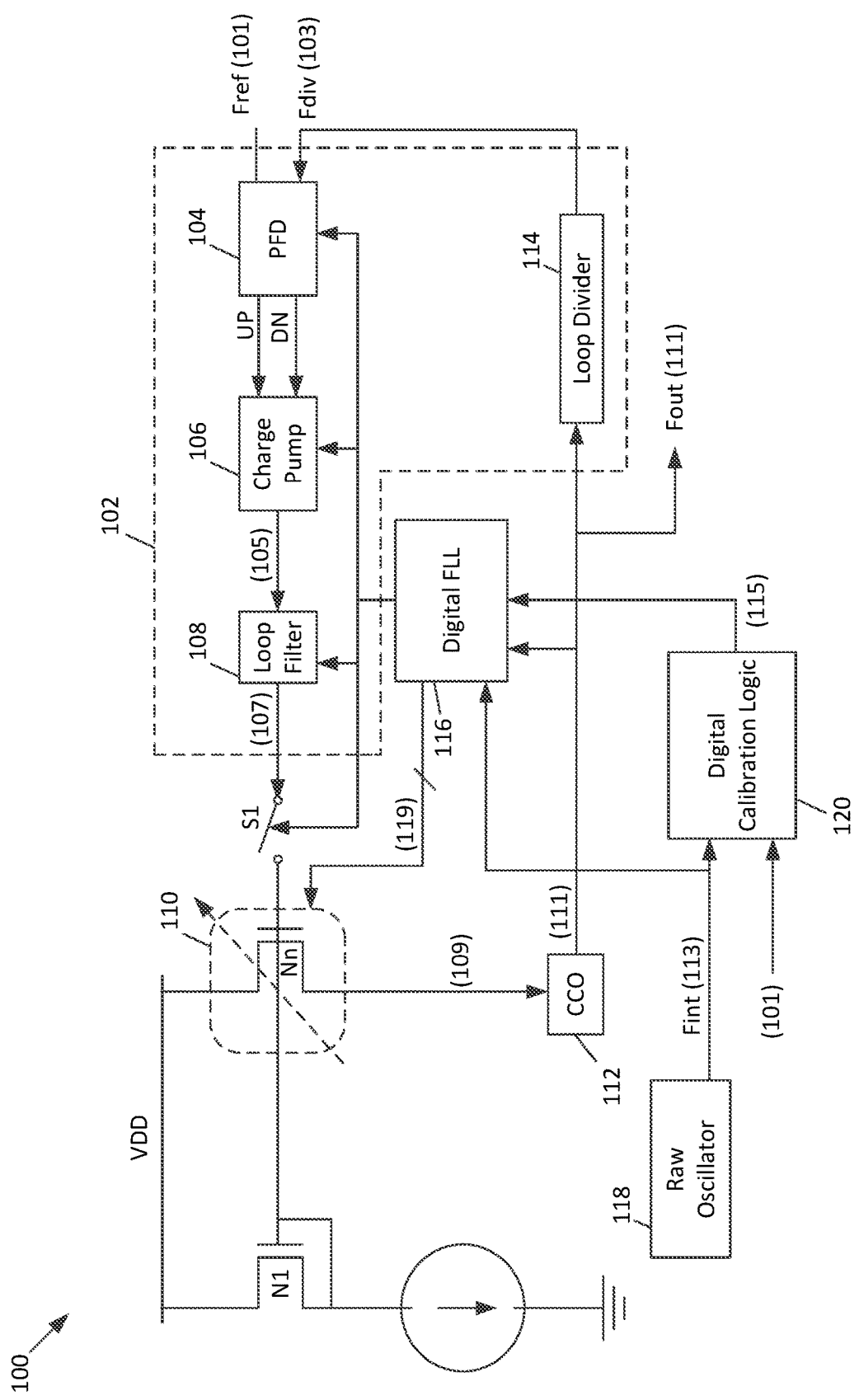
FIG. 2 is a schematic block diagram of a phase locked loop, together with a digital frequency locked loop for configuration of the oscillator used by the phase locked loop, in accordance with this disclosure.

With reference to FIG. 2, a circuit 100 is now described. The circuit 100 includes a phase locked loop (PLL) 102 receiving as input an input signal 101 having an input frequency Fref, and a feedback signal 103 having a feedback frequency Fdiv. It is desired for the PLL 102 to multiply the input frequency Fref to produce an output signal 111 having an output frequency Foutput equal to a desired frequency Fdesired.

As understood to those of skill in the art, the division factor FDIV used by the loop divider 114 in a PLL determines the multiplication factor. Therefore, the division factor FDIV is equal to Fdesired/Fref. For a sample input frequency Fref of 32 KHz to produce a desired frequency Fdesired of 72 MHz, the division factor Fdiv would therefore be 2250. While the PLL 102 is capable of operating with this division factor, the time to reach lock (for Foutput to equal Fdesired) is about 1 millisecond. This is undesirable for some applications, as a lock time of around 100 µs would be preferable. Therefore, the Inventors have devised the following scheme to utilize a digital frequency locked loop 116 (digital FLL) to quickly set the current controlled oscillator (CCO) 112 used by the PLL 102 to the desired frequency Fdesired, so as to enable quicker lock of the PLL 102.

A raw oscillator 118 is employed generate an intermediate signal 113 having an intermediate frequency Fint intended to be equal to a geometric mean of the input frequency Fref and the desired output frequency Fdesired. However, the raw oscillator 118 is not ideal, and therefore the frequency Fint of the intermediate signal 113 will not actually be equal to this geometric mean.

The intermediate signal 113 is provided to digital calibration logic 120, which counts the number of cycles of the intermediate signal 113 that occur in one cycle of the input signal 101 with the frequency Fref, and generates a division factor FDIV2 by dividing this count by the division factor FDIV for the PLL 102. The division factor FDIV2 is provided as signal 115 to the digital FLL 116, which generates a control signal 119 to control the voltage-to-current converter 110, which in turn generates a CCO control signal 109 for controlling the current controlled oscillator 112. The voltage-to-current converter 110 contains multiple NMOS transistors Nn in a current mirror relationship with NMOS transistor N1, and the control signal 119 selects how many of the NMOS transistors Nn of the voltage-to-current converter 110 are turned on.

The digital FLL 116 counts the number of cycles of output frequency Foutput of the output signal 111 in the frequency Fint of the intermediate signal 113 produced by the raw oscillator 118, and compares this count with FDIV2. Based on this comparison, the digital FLL 116 generates a control signal 119 for the voltage-to-current converter 110, which in turn adjusts the CCO control signal 109. When the number of cycles of the output frequency Foutput of the output signal 111 in the frequency Fint of the intermediate signal 113 is equal to FDIV2, the digital FLL 116 has locked. At this point, logic circuitry in the digital FLL 116 enables the phase frequency detector PFD 104, charge pump 106 and loop filter 108, and closes switch Si to short the output 107 of the loop filter 108 to the voltage-to-current converter 110. Also, at this point, logic circuitry in the digital FLL 116 switches off the raw oscillator 118 and digital FLL 116, eliminating the power consumption thereby.

Since switch Si is closed, shorting the output 107 of the loop filter 108 to the voltage-to-current converter 110, the PLL 102 is now active, and controls the voltage-to-current converter 110 to thereby generate the appropriate CCO control signal 109 to achieve PLL lock. Since operation of the PLL 102 begins with the CCO 112 as already set to the desired frequency Fdesired, lock of the PLL 102 occurs quickly. Since FDIV2 is much less than FDIV, the time for the digital FLL 116 to lock is much less than the PLL 102 would take in the absence of the digital FLL 116 having pre-set the CCO 112 to Fdesired.

Consider an example of operation of the circuit 100 in which it is desired for the PLL 102 to produce a 72 MHz output signal (Fdesired) from a 32 KHz input signal (Fref). NDIV=Fdesired/Fref=72 MHz/32 KHz=2250. Therefore, NDIV for the PLL 102 is 2250. The geometric mean of the input frequency 32 KHz and the desired output frequency 72 MHz is calculated as $\sqrt{32 \text{KHz} * 72 \text{MHz}}=1.518$ MHz, although an approximation of $\sqrt{\text{FDIV}} * \text{Fref}$ may be used, which here would be calculated as $\sqrt{2250} * 32$ KHz=1.504 MHz.

Assuming for the sake of example that the frequency Fint of the intermediate signal 113 turns out to be 1.2 MHz instead of ~1.5 MHz, the digital calibration logic 120 would divide Fint by the input frequency Fref, which here would be 1.2 MHz/32 KHz=37.5. FDIV2 is then calculated as FDIV2=FDIV/37=2250/37.5=60. The FDIV2 value of 60 is then passed to the digital FLL 116. Since 60 is much smaller than 2250, as stated, the digital FLL 116 reaches lock quickly.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method, comprising:
   generating an intermediate reference signal having an intermediate reference frequency between a desired output frequency and a reference frequency of a reference signal;

setting an output frequency of a controllable oscillator to the desired output frequency using a first locked loop having a first loop divider value, the first loop divider value being set such that the intermediate reference frequency multiplied by the first loop divider value is equal to the desired output frequency; and in response to achieving lock of the first locked loop, coupling the controllable oscillator to a second locked loop and activating the second locked loop.

2. The method of claim 1, wherein the second locked loop has a second loop divider value greater than the first loop divider value.

3. The method of claim 2, further comprising setting the first loop divider value to be equal to the desired output frequency by counting a number of cycles of the intermediate reference signal in the reference signal, and dividing the second loop divider value by the counted number of cycles of the intermediate reference signal in the reference signal.

4. The method of claim 1, wherein the intermediate reference signal is generated using an oscillator configured to generate the intermediate reference signal as having the intermediate reference frequency equal to a geometric mean of the reference frequency and the desired output frequency, but due to unideal behavior of the oscillator, the intermediate reference frequency is not actually equal to the geometric mean of the reference frequency and the desired output frequency.

5. The method of claim 1, further comprising setting the first loop divider value to be equal to the desired output frequency by counting a number of cycles of the intermediate reference signal in the reference signal, and dividing a second loop divider value of the second locked loop by the counted number of cycles of the intermediate reference signal in the reference signal.

6. A circuit, comprising:
an oscillator configured to generate an intermediate signal having a frequency equal to a geometric mean of an input frequency and a desired output frequency, but due to unideal behavior of the oscillator, actually generating the intermediate signal as having a frequency between the input frequency and a desired output frequency but not equal to the geometric mean of the input frequency and the desired output frequency;
a controllable oscillator;
calibration logic configured to estimate a result of a division of the desired output frequency by the frequency of the intermediate signal to produce a first locked loop divider value;
a first locked loop configured to set the controllable oscillator to the desired output frequency by causing multiplication of the input frequency by the first locked loop divider value; and
a switch coupling a second locked loop to control the controllable oscillator in response to the first locked loop achieving lock, the second locked loop configured to maintain the controllable oscillator at the desired output frequency.

7. The circuit of claim 6, wherein the calibration logic is configured to estimate the result of the division of the desired output frequency by the frequency of the intermediate signal by counting cycles of the intermediate signal, and dividing an intended locked loop divider value by the count to produce the first locked loop divider value, the intended locked loop divider value being that which would produce the desired output frequency when multiplied by the input frequency.

8. The circuit of claim 6, wherein the controllable oscillator is a current controlled oscillator (CCO).

9. The circuit of claim 6, wherein the first locked loop comprises a frequency locked loop.

10. The circuit of claim 9, wherein the frequency locked loop is a digital frequency locked loop.

11. The circuit of claim 6, wherein the second locked loop comprises a phase locked loop.

12. The circuit of claim 11, wherein the phase locked loop is a digital phase locked loop.

13. The circuit of claim 6, wherein the first locked loop comprises a frequency locked loop; and wherein the second locked loop comprises a phase locked loop.

14. The circuit of claim 6, wherein the calibration logic, upon the first locked loop achieving lock, closes the switch, enables the second locked loop, disables the controllable oscillator, and disables the first locked loop.

15. The circuit of claim 14, wherein the calibration logic, in an initial startup phase, disables the second locked loop, opens the switch, enables the controllable oscillator, and enables the first locked loop.

16. A circuit, comprising:
an input receiving a reference signal having an input frequency;
an oscillator configured to generate an intermediate signal having a frequency between the input frequency and a desired output frequency;
calibration logic configured to generate a loop division number that would produce the desired output frequency when multiplied by the frequency of the intermediate signal; and
a locked loop circuit comprising:
a controllable oscillator;
a first locked loop portion coupled to the controllable oscillator, receiving as input the intermediate signal and the loop division number, and configured to cause the controllable oscillator to generate a first locked loop output signal having an output frequency substantially equal to the desired output frequency; and
a second locked loop portion coupled to the controllable oscillator and configured to cause the controllable oscillator to generate a second locked loop output signal having a frequency substantially equal to the desired output frequency and having a phase locked to a phase of the reference signal.

17. The circuit of claim 16, wherein the calibration logic generates the loop division number by: counting a number of cycles of the intermediate signal in one cycle of the reference signal, and dividing an intended loop division number by the count to produce the loop division number, the intended loop division number being that which would produce the desired output frequency when multiplied by the input frequency.

18. The circuit of claim 16, further comprising control circuitry configured, in a startup phase, to:
switch on the first locked loop portion and the controllable oscillator;
wait for the first locked loop portion to lock; and
when the first locked loop portion locks, couple the second locked loop portion to the controllable oscillator, and switch off the first locked loop portion and switch off the oscillator.

19. The circuit of claim 16, wherein the first locked loop portion is a frequency locked loop portion.

20. The circuit of claim 16, wherein the second locked loop portion is a phase locked loop portion.

21. The circuit of claim 16, wherein the first locked loop portion is a frequency locked loop portion; and wherein the second locked loop portion is a phase locked loop portion.

\* \* \* \* \*

UNITED STATES PATENT AND TRADEMARK OFFICE
CERTIFICATE OF CORRECTION

PATENT NO. : 10,840,915 B2
APPLICATION NO. : 16/740871
DATED : November 17, 2020
INVENTOR(S) : Nitin Gupta et al.

It is certified that error appears in the above-identified patent and that said Letters Patent is hereby corrected as shown below:

In the Specification

At Column 4, Line 20, please replace [[ Si ]] with -- S1 --.

At Column 4, Line 25, please replace [[ Si ]] with -- S1 --.

Signed and Sealed this
First Day of June, 2021

Drew Hirshfeld
*Performing the Functions and Duties of the*
*Under Secretary of Commerce for Intellectual Property and*
*Director of the United States Patent and Trademark Office*